United States Patent [19]

Chren, Jr.

[11] Patent Number: 5,430,764
[45] Date of Patent: Jul. 4, 1995

[54] DIRECT DIGITAL FREQUENCY SYNTHESIZER

[75] Inventor: William A. Chren, Jr., Jenison, Mich.

[73] Assignee: Grand Valley State University, Allendale, Mich.

[21] Appl. No.: 115,464

[22] Filed: Sep. 1, 1993

[51] Int. Cl.⁶ .................................. H04L 27/20
[52] U.S. Cl. .................. 375/308; 364/718; 331/187
[58] Field of Search .......... 375/67, 52; 328/14; 307/260, 262; 331/34, 56, 107 R, 187, DIG. 3; 364/718

[56] References Cited

U.S. PATENT DOCUMENTS

| | | | |
|---|---|---|---|
| 3,735,269 | 5/1973 | Jackson | 328/14 |
| 4,835,721 | 5/1989 | Becker et al. | 364/717 |
| 5,179,348 | 1/1993 | Thompson | 328/14 |

OTHER PUBLICATIONS

"A Digital Frequency Synthesizer," Joseph Tierney et al., IEEE Transactions on Audio and Electroacoustics, vol. AU-19, No. 1, Mar. 1971, pp. 48-56.
"Techniques for Residue-to-Analog Conversion for Residue-Encoded Digital Filters," W. Kenneth Jenkins, IEEE Transactions on Circuits and Systems, vol. CAS-25, No. 7, Jul. 1978, pp. 555-562.
"An Improved Residue Number System Digital-to-Analog Converter," M. A. Soderstrand et al., IEEE Transactions on Circuits and Systems, vol CAS-30, No. 12, Dec. 1983, pp. 903-907.
"An Analysis of the Output Spectrum of Direct Digital Frequency Synthesizers in the presence of Phase-Accumulator Truncation," H. T. Nicholas, III et al., IEEE 41st Annual Frequency Control Symposium-1987, pp. 495,502.
"A Direct Digital Synthesizer with 100-MHz Output Capability," P. H. Saul et al., IEEE Journal of Solid State Circuits, vol. 23, No. 3, Jun. 1988, pp. 819-821.
"Digitally Controlled Oscillator," B. Giebel et al., IEEE Journal of Solid-State Circuits, vol. 24, No. 6, Jun. 1989, pp. 640-645.
"A High-Speed Direct Frequency Synthesizer," P. H. Saul et al., IEEE Journal of Solid-State Circuits, vol. 25, No. 1, Feb. 1990, pp. 215-219.
"Direct-Digital Synthesis Applications," A. Edwin, Microwave Journal, Jan. 1990, pp. 149-151.
"A 700-MHZ 24-Bit Pipelined Accumulator in 1.2-UM CMOS for Application as a Numerically Controlled Oscillator", F. Lu et al., IEEE 1991 Custom Integrated Circuits Conference, pp. 25.3.1-25.3.4.
"Qualcomm A2334 Dual Direct Digital Synthesizer, Technical Data Sheet," Qualcomm, Inc. VLSI Products Division, 10555 Sorrento Valley, San Diego, Calif., Jan. 1992, DL90-2334 A.
"Low-Latency, High-Speed Numerically Controlled Oscillator Using Progression-of-States Technique" M. Thomas, IEEE Journal of Solid-State Circuits, vol. 27, No. 1, Jan. 1992, pp. 113-117.

Primary Examiner—Stephen Chin
Assistant Examiner—Don N. Vo
Attorney, Agent, or Firm—Varnum, Riddering, Schmidt & Howlett

[57] ABSTRACT

A direct digital frequency synthesizer employs residue number system based processors to generate output waveforms of desired frequencies. The frequency synthesizer includes a phase accumulator comprising a plurality of individual adders, each adding a predefined quantity to a digit of a frequency setting word in which the individual digits are residue digits of differing moduli. The outputs of the independent adders form a combined residue output word which is used to address a memory storing signal samples. In one embodiment of the invention, the memory is a dual port ROM storing samples of one-quarter of a sine wave and the dual port ROM is simultaneously addressed to read a selected sample and an associated sample corresponding to the magnitude of a sample of the sine wave advanced by 90° from the first sample. A sample select logic circuit selects one of the outputs of the dual port memory on the basis of selected bits of the combined residue word and data bits stored in the ROM with the samples to select and determine the sign of the sample of the sine wave. In another embodiment of the invention, the memory comprises a plurality of independent memories, corresponding to the number of independent adders, each storing residue information and a residue processing array processes the residue data obtained from the independent memories and provides a residue encoded signal to a residue-to-analog converter which generates the desired analog output.

22 Claims, 11 Drawing Sheets ns DIRECT DIGITAL FREQUENCY SYNTHESIZER

BACKGROUND OF THE INVENTION

1. Field of the Invention

The invention relates to digital frequency synthesizers and/or particularly to digital frequency synthesizers employing residue number system based processors.

2. Background Art

It is well known that analog signals of a number of different frequencies may be generated from a single source frequency by the use of analog circuits or by a combination of analog and digital circuits. In a technique known as Direct Digital Frequency Synthesis, digital data representing samples of sinusoidal wave forms of different frequencies are converted to analog sinusoidal output signals using a digital-to-analog converter. In many cases the digital data is acquired from a memory, in which are stored the values of a single cycle (or portion thereof) of a sinusoidal wave form taken at uniformly spaced intervals. The sequence of digital data points to be converted is generated by retrieval of the stored points in a uniform fashion, usually periodic. The methodology for generating the data points is well known and described in technical publications. The circuitry for selecting and retrieving the appropriate digital samples to be applied to the digital-to-analog converter is generally referred to as a numerically controlled oscillator and may be used independently of the converter. State-of-the-art numerically controlled oscillators are typically implemented in integrated circuitry.

As a result of ever more stringent performance specifications required of frequency synthesizers for many different applications, such as spread spectrum and frequency hopping and other high precision applications, interest in direct digital synthesizers has increased. For high precision applications, the direct digital frequency synthesizers offer important advantages over analog synthesizers. They offer ultrahigh frequency resolutions, exceptionally fast and phasecontinuous frequency switching and the reproducibility inherent in the use of digital techniques.

Most direct digital frequency synthesizers use essentially the same method, referred to as the Sine Table Lookup Method. In this method, a sinusoidal output signal is generated by periodically accessing stored digital samples of a sine wave and converting the samples to an analog signal by means of a digital-to-analog converter. The memory in which the samples are stored is commonly addressed from a sequential address generator. The basic structure of a typical prior art direct digital frequency synthesizer is shown in FIG. 1. The direct digital frequency synthesizer consists of a numerically controlled oscillator 100 driving a translator 103, read-only memory 105, latch 106, digital-to-analog converter (DAC) 107, and low pass filter (LPF) 108. The numerically controlled oscillator, 100, also known as an address generator or phase accumulator, consists of a binary adder 101 and latch 102 in which the adder output is latched in every clock cycle of the system clock $f_c$. A digital frequency setting word k defining an address increment value is applied to the adder 101. The output of the latch 102, which stores the output of the adder 101, is added to the frequency setting word in each clock cycle using feedback. Thus, a new memory address is generated in each clock cycle. Furthermore, successive memory addresses differ by the value of the frequency setting word. The output of the latch 102 is applied to a translator 103 before it is applied to a read-only memory (ROM) 105. The read-only memory 105 typically stores data words representing samples taken at uniformly spaced intervals on a single period (or portion thereof) of a sine wave form. The frequency setting word defines the spacing between the accessed memory samples, and in so doing determines the frequency of the output wave form. Since sinusoidal wave forms possess quarter-wave symmetry, the memory 105 typically stores the values for only one quadrant of the sine wave, and the translator 103 modifies the phase accumulator-computed address accordingly so that the proper sample value is accessed. The output from the memory 105 is clocked to a latch 106 and applied to a digital-to-analog converter 107 to generate the corresponding analog sine wave. The generated sine wave usually is passed through a low pass filter 108 to smooth out the generated signal.

There are several figures of merit for direct digital frequency synthesizers. They include frequency resolution, frequency range and frequency switching time. Frequency resolution is the smallest change that can be generated in the output frequency. Alternatively, it is the lowest non-zero frequency that can be generated. It is improved (i.e., made smaller) by increasing the width (i.e., the number of bits) in the phase accumulator adder. Frequency range is the largest frequency that can he generated. It is dependent on the system clock frequency $f_c$ (see FIG. 1). Frequency switching time is the time required to change the frequency of the output signal from one frequency to another. This represents the time for the new value of k and its effects to pass through all the circuitry from the Phase Accumulator to the output.

In a typical binary adder, as used in the Phase Accumulator 100, the time required to perform addition increases as a function of the number of bits in the operands that are being added, since their corresponding bits must be added on a bit by bit basis, taking into consideration a carry-out output from the neighboring less significant bit. It is not uncommon for direct digital frequency synthesizers to use a 36 or 40 bit wide frequency setting word and adder. Thus, the addition process in the Phase Accumulator is relatively slow, and is considered to be the "bottleneck" in these devices. To reduce the effects of this time delay on the data throughput rate, pipelined binary adders are frequently used. Pipelined binary adders add the two operands together bit-by-bit, one pair of bits per clock cycle. In this "assembly line" fashion, many partial sums are being computed at any time, and an adder output sum is generated in each clock cycle. FIG. 2 is a diagrammatic representation of a typical pipelined binary adder architecture, widely used in the art. The binary adder of FIG. 2 is a 4-bit binary adder pipelined into four separate stages. $A_0$, $B_0$ through $A_3$, $B_3$ shown in FIG. 2 represent operands to be added. $C_{in}$ represents an input carry and $C_0$ through $C_2$ represent intermediate carry outputs. $C_0$ and $S_0$ through $S_3$ represent the output of the adder. Individual stages are separated by latches that are clocked by the system clock signal $f_c$. The 4-bit, 4-stage adder requires four clock cycles before the sum is properly generated. However, once the pipeline is filled, a new adder output sum is generated in every clock cycle. This represents an increase in data throughput rate above that which would be achieved without pipelining.

A problem arises when a change of input operand must be made. In the phase accumulator, this corresponds to a switch of the frequency setting word k. That is, to switch over from one analog output frequency to another, the frequency setting word is changed. However, all internally latched data in the pipeline adder must be cleared before the new output is generated, introducing a significant delay. By way of example, in a 36 bit-pipelined adder, there are 36 pipelined stages, and the frequency switching time therefore is 36 clock cycles. This time period is referred to as latency. It will be readily apparent that a low latency accumulator is desirable. For example, in frequency modulation applications, the speed with which the output frequency can be changed determines the maximum frequency of the information signal that can be used to modulate a carrier. The lower the latency, therefore, the higher the maximum frequency of the signal. One attempt at providing a low latency accumulator is described in a technical paper entitled "Low-Latency, High-Speed Numerically Controlled Oscillator Using Progression-Of-States Technique," by Matthew Thompson, IEEE Journal of Solid-State Circuits, Volume 27, No. 1, January, 1992, pp. 113–117. The Thompson paper proposes to reduce latency in a numerically controlled oscillator by essentially replacing pipeline stages by output feedback, essentially "folding" the stages into one another. This scheme necessitates holding the frequency setting word constant for four clock cycles. Such a solution is impractical because, despite the fact that it reduces the number of pipeline stages, it does not solve the essence of the latency problem, which is the speed with which the output sinusoid frequency can be changed.

As stated earlier, high frequency resolution implies a large number of bits used to represent the frequency setting word and, therefore, a large adder, consuming a sizable amount of chip area in an integrated circuit implementation. This large adder will contain many pipeline stages and will possess a large latency. Also, in integrated circuit implementations the memory which stores the samples to be applied to the digital-to-analog converter, typically a read-only-memory (ROM), consumes much of the chip area. It is well known that larger chip areas mean lower manufacturing yields and higher costs. For this reason, it is desirable to reduce the size of the ROM, without, of course, reducing the capabilities of the circuit.

SUMMARY OF THE INVENTION

These and other problems of the prior art are solved in accordance with the present invention by means of high speed circuitry implementing a numerically controlled oscillator for use in a direct digital frequency synthesizer on the basis of the Residue Number System, rather than on the basis of the traditional binary number system. The residue number system represents an integer as the vector of its residues modulo a fixed, specially chosen set of integers called moduli. Advantageously, in accordance with the invention, the addition operations in the phase accumulator to generate memory addresses are performed in parallel using small, independent adders in each digit position. These small adders operate simultaneously, without passing carry information to each other, since only the residue has significance in this system. Although each adder is itself bit-pipelined, the number of pipeline stage delays (i.e., latency) is drastically reduced because the adders are small, operate independently and simultaneously generate final output digits. Advantageously, the number of latches needed in the pipelined adder, in the system of this invention, is much smaller than in prior art system. Therefore, the chip area (and thus manufacturing cost) of the arithmetic circuit in the phase accumulator of this invention is reduced significantly.

In accordance with a particular aspect of the invention, a direct digital frequency synthesizer has a plurality of small, discrete memories rather than a single large memory. Each of the small, independent memories is addressed from corresponding small, independent adders of the phase accumulator. Each of the memories stores one multi-residue operand. The set of these operands, from all memories, is used to compute a multi-residue digit word defining a selected sample of an output signal to be generated. The computation is done using known residue computational hardware such as adders, subtracters, multipliers and scalers. The computational hardware is embodied in a residue processing array. The output samples are encoded in residue and are applied to a residue-to-analog converter to produce the desired sine wave output signal.

In accordance with another aspect of the invention, an enhancement to the residue processing array allows it to generate output samples of the same sinusoidal waveform and its complex conjugate.

BRIEF DESCRIPTION OF THE DRAWING

An illustrative embodiment of the invention is described below with reference to the drawing in which.

DETAILED DESCRIPTION

Figure 1:
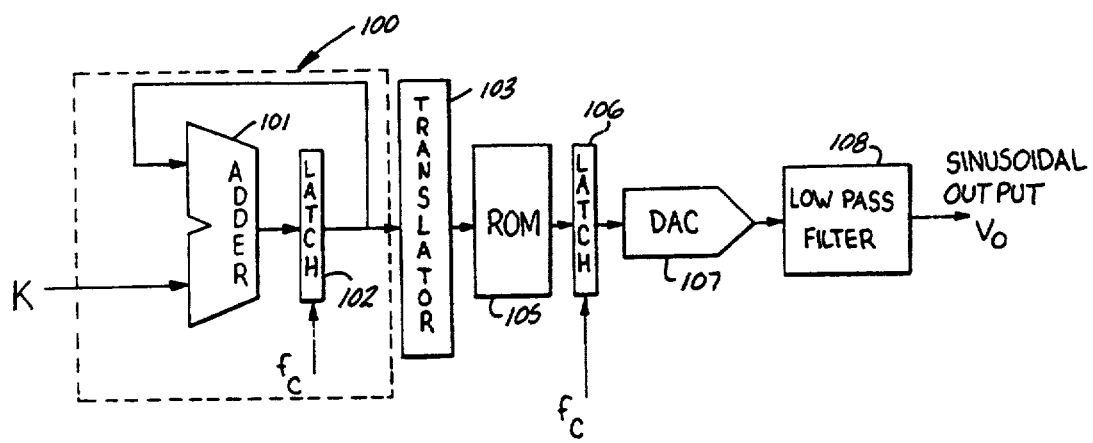
FIG. 1 is a block diagram representation of a prior art direct digital synthesizer.
Figure 2:
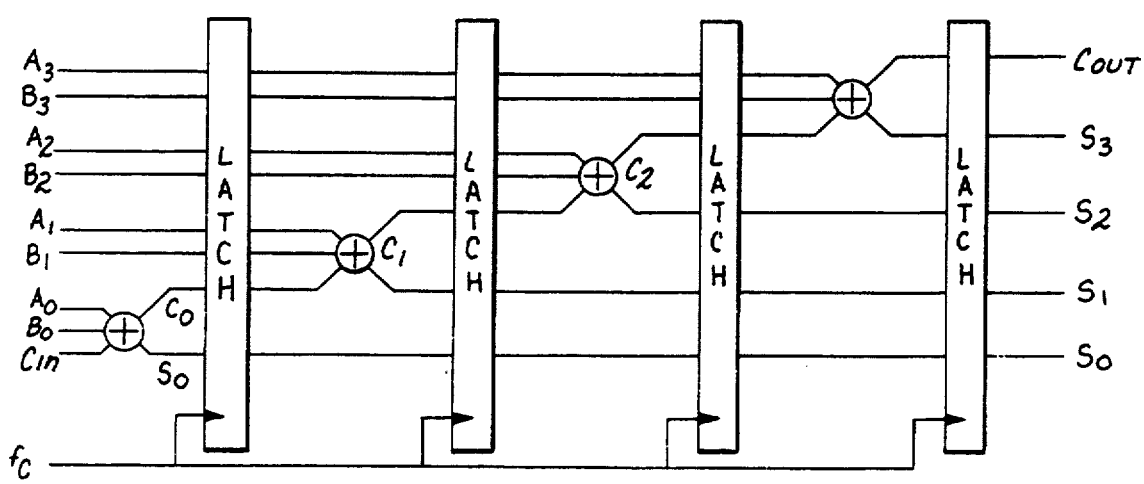
FIG. 2 is a block diagram representation of a prior art pipelined adder circuit.
Figure 3:
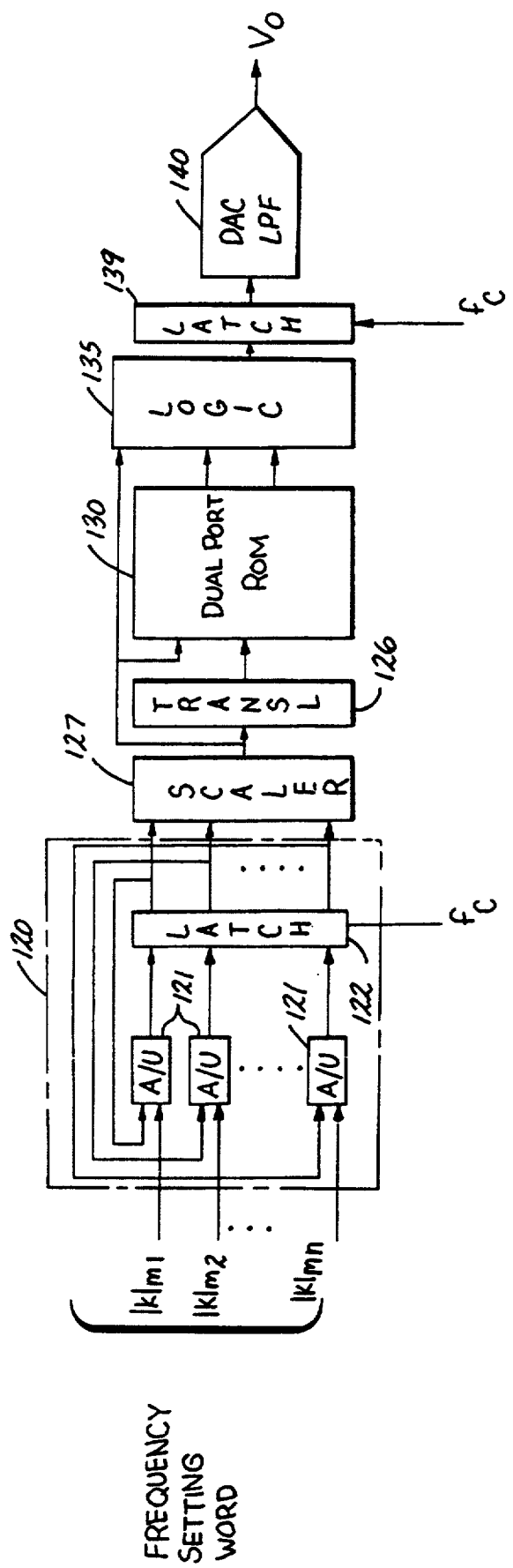
FIG. 3 is a block diagram representation of a direct digital frequency synthesizer incorporating principles of the invention.

FIG. 3 is a block diagram representation of a direct digital frequency synthesizer based on the residue number system, in accordance with the principles of the invention. The principles of residue arithmetic are described in "Residue Arithmetic and Its Applications to Computers," by Szabo and Tanaka, McGraw-Hill, 1967. In the circuit of FIG. 3, a frequency setting word k, comprising n residue digits, each defined in terms of a different modulus, is applied to a phase accumulator 120 which produces an output word consisting of n residue digits, each defined in terms of the modulus of the corresponding input digit. The frequency setting word is encoded using n pair-wise relatively prime integers called moduli, which are fixed for a particular design. This means that any integer numbers may be used which do not share a common divisor other than 1. By way of example, for n=7, the set of integers 64, 63, 61, 59, 55, 53, 47 can be used as the moduli. With this choice, any frequency setting word between 0 and one less than the product of the moduli is readily represented by seven digits. Each digit is an integer and is encoded in the standard unsigned binary way, i.e., multiple binary bits. The value of a digit is equal to the integer remainder that results when the operand is divided by the modulus to which the digit corresponds. In the above example of seven moduli, each of the seven integers may be represented in six-bit binary, as is well known in the art. Thus, in this example, the frequency setting word k has seven 6-bit digits in its representation, and the phase accumulator 120 has seven arithmetic units, m1 through m7 121. Each of the seven units is a six-bit binary adder. Since the arithmetic units operate in parallel and there is no carry propagation between them, the maximum delay through the phase accumulator, and therefore the maximum latency, is six clock cycles, assuming that the binary adders are implemented in the manner shown in FIG. 2.

In the traditional architecture, the latency would be 42 clock cycles. Therefore, in the system in accordance with this invention the phase accumulator latency is drastically reduced.

The output of the phase accumulator 120 is used to address a well-known dual port read-only memory 130, via a scaler circuit 127 and a translator 126. The ROM 130 stores data defining samples of sinewaves to be generated. The data read from ROM 130 is applied to a known digital-to-analog converter 140, via a sample select circuit 135 and latch 139. The converter 140 may include a standard low pass filter to smooth the output signal.

Each of the independent circuits 121 of phase accumulator 120 generates a multibit binary number output and a carry output. However, in the residue number system, the carry output of each adder is ignored. The binary number at the output of each of the arithmetic units 121, representing the remainder, or residue, is stored in a latch 122. Latch 122 may be a conventional flip-flop memory, operating under control of the system clock $f_c$. Assuming that the arithmetic units 121 are each implemented as a pipelined binary adder, similar to that shown in FIG. 2, a new output will be stored in the latch once every system clock cycle. The output of the segment of the latch corresponding to one of the arithmetic units 121 is applied as an input to the corresponding arithmetic unit, in feedback fashion, to generate the corresponding residue digit of the next address. The output of the latch is also applied to the scaler circuit 127.

The scaler circuit 127 reduces the number of digits in the multidigit output word of the phase accumulator 120. The individual residue digits generated by the phase accumulator, when taken together, represent a memory address which may be used to selectively access a memory address location of ROM 130. In response, the ROM will provide data from the selected location to the digital to analog converter 140 for the generation of an analog sine wave output. As discussed earlier, a large frequency setting word is desirable in order to obtain high frequency resolution. However, the size of the frequency setting word also dictates the size of the phase accumulator output, and therefore, without modification, would mean the use of a prohibitively large ROM. In traditional architectures which use the binary number system, the phase accumulator output is truncated by ignoring several of the least significant bits. This process does not affect the frequency resolution. However, since it corresponds to division by a factor which depends on the number of bits removed, it will affect the phase resolution of the device. In practical situations this is deemed to be a good tradeoff. It has the effect of less-completely representing the stored sine wave, but pays the dividend that a smaller ROM can be used. In residue based architectures, the equivalent operation to truncating an operand is known as scaling. It is a process whereby the number of residue digits of a computational result is reduced.

Figure 4:
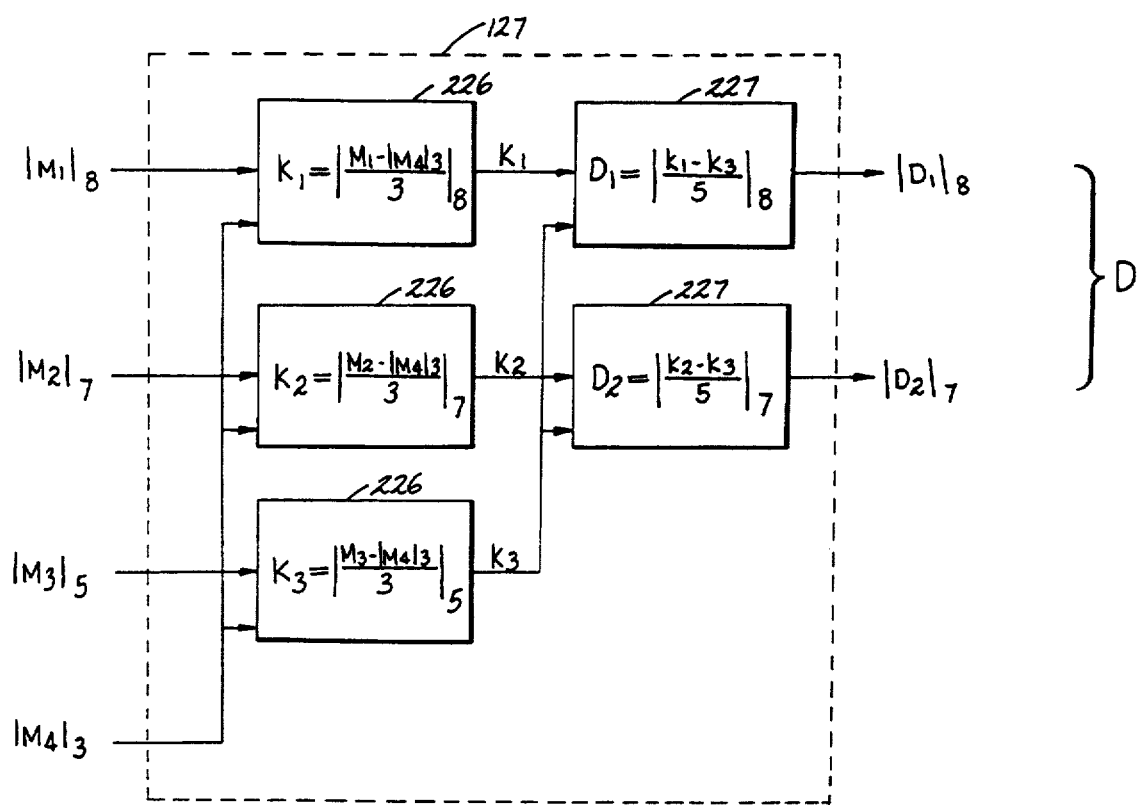
FIG. 4 is a more detailed block diagram representation of the scaler circuit 127 of FIG. 3 for a particular example.

FIG. 4 is a block diagram representation of an example of the residue scaler 127. The residue scaler circuit 127 of FIG. 4 is a relatively simple circuit which serves to illustrate the circuit architecture. This circuit has four residue inputs M1 through M4, each representing a residue number in a different modulus. By way of example, moduli 8, 7, 5, and 3 are used. The circuit of FIG. 4 is a two-stage scaler reducing the number of input digits by 2. A separate, vertical column of modscaler circuits 226 is required for each digit to be truncated.

Each of the modscaler circuits 226 in the scaler 127 is referred to as an $M_i$, $M_j$ modscaler and performs modulo $M_i$ subtraction with premultiplication by $M_j^{-1}$ to implement the function $K = |M_j^{-1}(a-b)|_{M_i}$ where $M_j$ is the modulus of the digit being truncated and $M_i$ is the modulus of the other input digit, where a and b are input digit values modulo $M_i$ and $M_j$, respectively, and where K is the output modulo $M_i$. The entire computation is performed modulo $M_i$. In FIG. 4, the lower input to any modscaler is the digit being truncated, and its modulus is the value $M_j$.

In the example of FIG. 4, 4 input digits M1 (mod 8), M2 (mod 7), M3 (mod 5) and M4 (mod 3) are scaled to two output digits, D1 (mod 8) and D2 (mod 7). In the circuits 226, the values for k1 through k3 are computed by simultaneously subtracting the digit to be truncated (M4) from the respective input digits M1, M2 and M3 and dividing by 3 (the modulus whose digit is being truncated). In each case, the result is expressed modulo the remaining input digits i.e. 8, 7, and 5, respectively. The same procedure is performed in circuits 227 to yield the reduced set of output digits D2, D1.

The functions of circuits 226 and 227 may be readily executed by using standard arithmetic logic circuitry or may be implemented using ROM lookup tables in a well-known fashion.

The dual port ROM memory 130 stores first quadrant samples of a sine wave to be generated. The address generated by the scaler 127, referred to as the scaler address, is applied to one address port of the ROM 130, address port #1, and is used to access a memory location in which a first quadrant sample of the selected sine wave is stored. The scaler generated address is applied to an address translator 126 as well as to the memory 130. The translator 126 modifies the scaler address and the modified address is applied to the other address port, address port #2, of the dual port ROM 130. The translator modified address is used to simultaneously access the memory location storing the first quadrant sine wave sample having the same magnitude as that of a sample located one quarter period advanced from the sample accessed by the scaler address, i.e. its 90° advanced value. This simultaneous dual addressing scheme allows the ROM 130 to store only the first quarter period of sine wave samples, while simultaneously providing two outputs, one of which is equal to the desired output sample, to within a sign change, on data port #1 and data port #2 of the ROM 130. Sample select circuit 135 selects the appropriate data port output and, if necessary, changes the sign of the ROM sample so that it is equal to actual desired sample of the selected sine wave.

Figure 5:
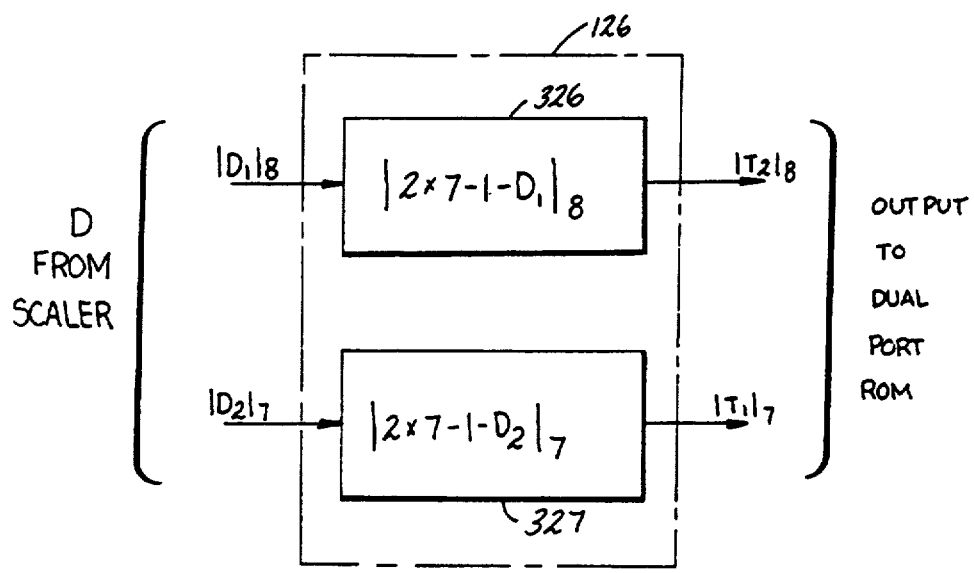
FIG. 5 is a more detailed block diagram representation of the translator of FIG. 3 for a particular example.

An exemplary block diagram representation of translator 126 is shown in FIG. 5 for two residue digits. Translator 126 consists of a plurality of arithmetic logic circuits, one for each residue digit provided to the translator from scaler 127. The individual circuits operate on their respective input residue digits independently and in parallel. The arithmetic logic circuits can be readily constructed from interconnected AND/OR logic gates or from commercially available programmable logic arrays (PLAs) in a well-known fashion. Each of the arithmetic logic circuits implements the function $T = 2^l S - 1 - D$, where l is two less than the number of binary bits in the even modulus, S is the product of the odd moduli, D is the input operand and T is the output operand.

In the present illustrative embodiment, the scaler 127 provides two output digits, a modulo 8 output digit and a modulo 7 output digit. Since there are two input digits only two arithmetic logic circuits 326, 327 are provided. Since the modulo 8 input digit is represented by 3 binary bits, $1 + 2 = 3$ and $l = 1$. S, which is the product of the odd moduli, is $7 \times 1 = 7$. Therefore the circuits 326, 327 both implement the function $T = 2 \times 7 - 1 - D = 13 - D$. The circuit 326 implements the function in modulo 8, and circuit block 327 implements that function in modulo 7, in a standard fashion. Hence, the output T2 of circuit block 326 is a modulo 8 digit and the output T1 of circuit block 327 is a modulo 7 digit.

Figure 6:
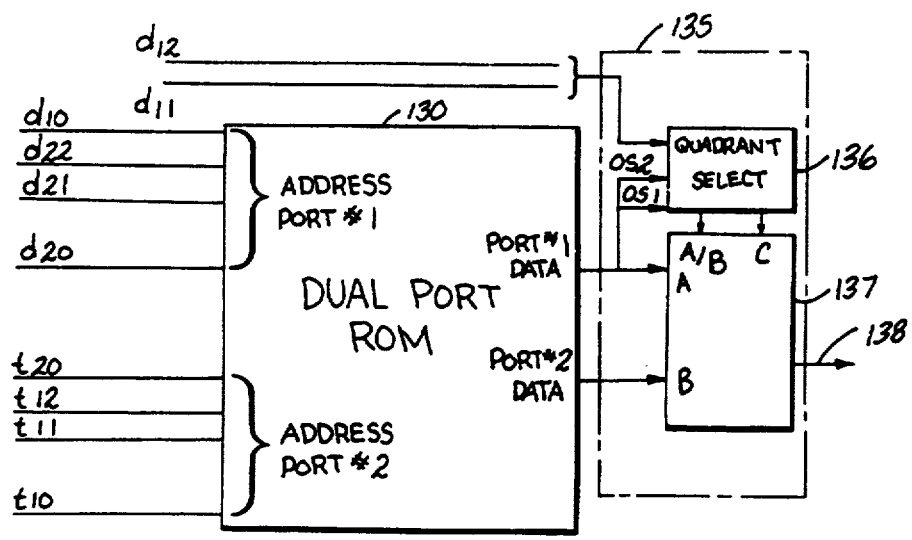
FIG. 6 is a more detailed representation of memory and sample select logic circuitry of FIG. 3.

A block diagram representation of the dual port ROM 130 and the sample select logic circuitry 135 is shown in FIG. 6. Address port #1 of ROM 130 receives all bits of all of the odd-modulus residue digits, and all but the two most significant bits of the even residue digit, from the output of the scaler 127. Address port #2 receives the bits in these same locations but from the translator 126, as described above. The information stored in the memory address locations defined by addresses applied to address port #1 or address port #2 is provided at data port #1 and data port #2, respectively. Input t20 to address port #2 in FIG. 6 represents the least significant bit of the modulo 8 translator output T2 and inputs t10, t11 and t12 represent the three bits of the modulo 7 translator output T1. Similarly, input d10 represents the least significant bit of the modulo 8 output D1 of scaler 127 and inputs d20, d21, and d22 to address port #1 represent the three bits of the modulo 7 output D2 of scaler 127. The two most significant bits d12, d11 of the even residue digit of the scaler output D1, are applied to the sample select logic 135. The two most significant bits of the modulo 8 translator output T2 are ignored.

Figure 7:
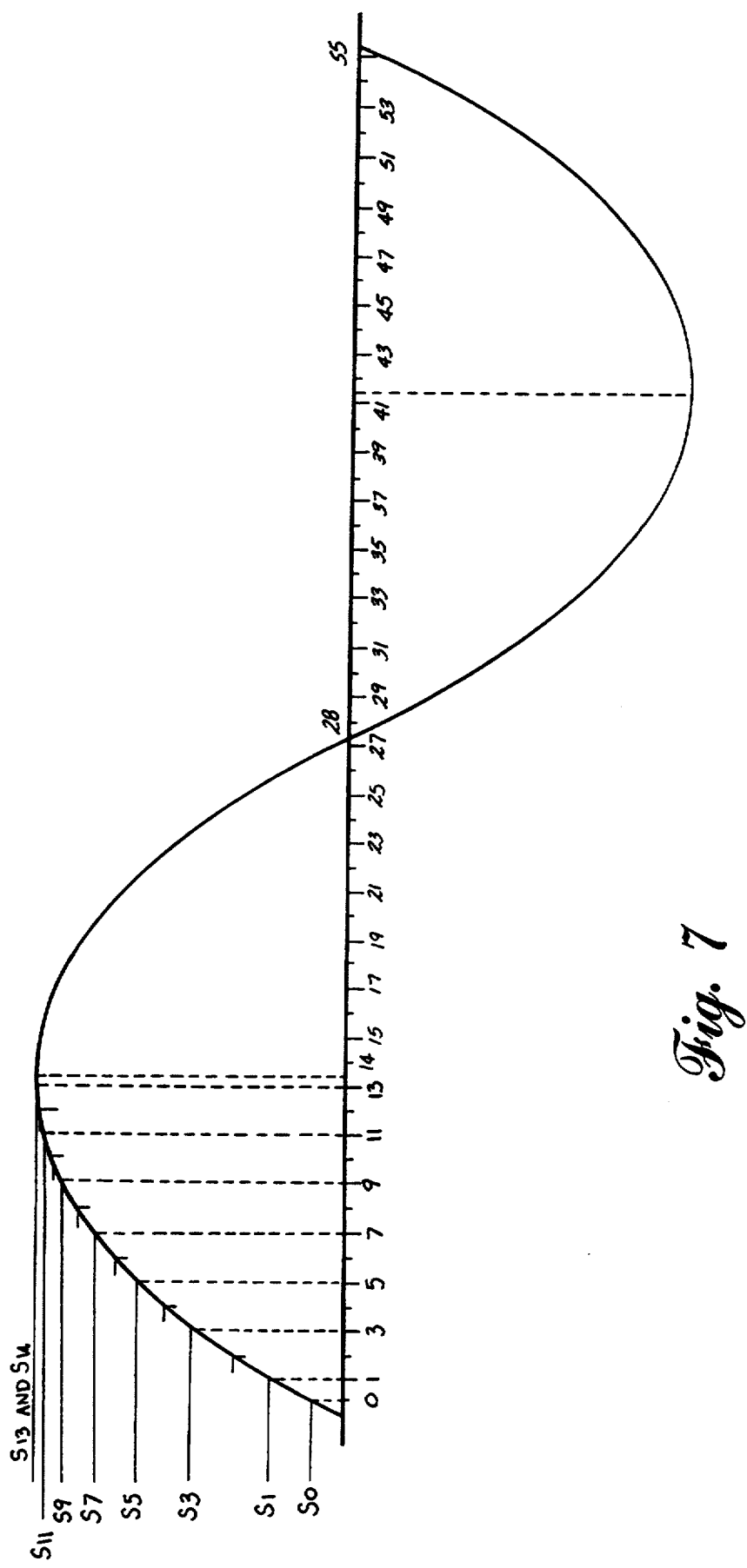
FIG. 7 is a representation of a sine wave identifying signal samples for a particular example.

As shown in FIG. 6, the sample select logic 135 consists of a quadrant select circuit 136 and a multiplexing circuit 137. The quadrant select circuit receives the two most significant bits, d12, d11 of the even residue digit of the scaler address, and two bits QS2, Qs1 from data port #1 of memory 130. It produces the control signals A/B and C for the multiplexer 137. A/B selects the port from which the output sample is to come. C indicates whether its value is to have its sign changed. As discussed previously, the samples on the ports lie in quadrants 1 and 2 of a sine waveform. Accordingly, one of the two samples is within a sign change of the desired output sample value. The quadrant select logic 136 uses bits QS2, QS1 (which are stored with the samples in the ROM) together with the two most significant bits of the even modulo digit to generate A/B and C, and thus select the proper value and change, if necessary, its sign. FIG. 7 shows a representative sine wave indicating predefined positions along the abscissa and identifying selected samples in the first quadrant.

As described earlier, the dual port ROM 130 is addressed simultaneously at address port #1 from scaler 127 and at address port #2 from translator 126. Address port #1 is used to address a selected sample in the first quadrant of the sine wave and address port #2 is used to address the sample that is 90° ahead of the sample corresponding to port #1. These two samples are made available to the sample select logic 135 on data port #1 and data port #2 respectively, of the ROM 130. The quadrant select logic 136 defines which of these two quantities is to be used and whether sign reversal is required by controlling the A/B and C inputs to the multiplexer 137, on the basis of the most significant bits d12, d11 of the even modulo digit and control bits QS2 and QS1 stored with the sample data.

The value of the two most significant bits of the even modulo digit, together with the port #1 address bits define a unique desired output sample in some quadrant of FIG. 7. Therefore, any ROM-stored sample, together with the two most significant bits of the even modulus, specifies uniquely the desired output sample. Furthermore, for a given stored sample, there are four possible actions to take: 1) choose port #1 sample; 2) same as 1 but change its sign; 3) choose the sample on port #2; or 4) choose the sample on port #2 and change its sign. The values of QS2 and QS1, stored with the samples, specify which action to take for a given sample. Note however, that any of the four possible actions can be required for any of the values of the most significant bits of the even modulus digit. The decision of what to do is performed by the quadrant select logic 136.

By way of example, the Table A shows values of D along the abscissa of FIG. 7 and generated by the scaler 127, and a binary encoding of these values as well as an exemplary encoding of the QS2 and QS1 control bits. The value D comprises a modulo 8 digit and a modulo 7 digit generated by the scaler 127. It will be apparent that 56 unique values can be generated with these moduli, of which 14 have been assigned to each quadrant of a sine wave to be generated, as shown in FIG. 7.

TABLE A

| D | D1 d12, d11, d10 | D2 d22, d21, d20 | Sample | QS2 | QS1 | Quadrant |
|---|---|---|---|---|---|---|
| 0 | 000 | 000 | S0 | 0 | 0 | 1 |
| 1 | 001 | 001 | S1 | 0 | 0 | 1 |
| 2 | 010 | 010 | S2 | 0 | 1 | 1 |
| 3 | 011 | 011 | S3 | 0 | 1 | 1 |
| 4 | 100 | 100 | S4 | 1 | 0 | 1 |
| 5 | 101 | 101 | S5 | 1 | 0 | 1 |
| 6 | 110 | 110 | S6 | 1 | 1 | 1 |
| 7 | 111 | 000 | S7 | 1 | 1 | 1 |
| 8 | 000 | 001 | S8 | 0 | 0 | 1 |
| 9 | 001 | 010 | S9 | 0 | 0 | 1 |

TABLE A-continued

| D | D1<br>d12, d11, d10 | D2<br>d22, d21, d20 | Sample | QS2 | QS1 | Quadrant |
|---|---|---|---|---|---|---|
| 10 | 010 | 011 | S10 | 0 | 1 | 1 |
| 11 | 011 | 100 | S11 | 0 | 1 | 1 |
| 12 | 100 | 101 | S12 | 1 | 0 | 1 |
| 13 | 101 | 110 | S13 | 1 | 0 | 1 |
| 14 | 110 | 000 | S0 | 0 | 0 | 2 |
| 15 | 111 | 001 | S1 | 0 | 0 | 2 |
| . | . | . | . | . | . | . |
| 28 | 100 | 000 | S0 | 0 | 0 | 3 |
| . | . | . | . | . | . | . |
| 42 | 010 | 000 | S0 | 0 | 0 | 4 |
| . | . | . | . | . | . | . |
| 55 | 111 | 110 | S13 | 1 | 0 | 4 |

It will be apparent from FIG. 7 that all values of D in Table A address sine wave samples in the first quadrant. Since the two most significant bits d12, d11 of the modulo 8 digit D1 are not used in addressing the memory, as described earlier, all memory addresses generated by the scaler 127 and the translator 126 fall within the memory address range of address locations 0 through 13. For output samples in quadrants other than the first quadrant, the appropriate first quadrant value is either advanced by 90° or the sign is reversed or both by the sample select logic 135. The most significant bits d12, d11 of the even modulo digit D1 vary in a predefined sequence in each of the four quadrants and the values of QS2 and QS1 are selected such that the two most significant bits d12, d11 are interpreted to indicate the proper quadrant. By way of example, in quadrant one, the QS2, QS1 bits are 0,0 when bits d12, d11, are 0,0; in quadrant two, QS2, QS1 are 0,0 when d12, d11 are 1,1; in quadrant three, QS2, QS1 are 0,0 when d12, d11 are 1,0; and quadrant four, QS2, QS1 are 0,0 when d12, d11 are 0,1. From the present example, it will be apparent that appropriate values for QS2, QS1 may be selected with various values of output D of scaler 127 when that output is expressed in terms of other residue digits, when at least one even modulus greater than or equal to 4 is used.

As explained earlier, the address generated by the translator 126 relates to the address generated by the scaler 127 in such a fashion that the address generated by the translator 126 corresponds to a location storing the value of a sample whose location on the sine waveform is advanced by 90° from the position defined by the address generated by the scaler 127. The scaler generated address is applied to address port #1 and the translator generated address is applied to address port #2 of ROM 130. These addresses are read simultaneously and the respective contents of the corresponding address locations are provided on data port #1 and data port #2, respectively, of ROM 130. By way of example, referring to FIG. 7, if the scaler generated address corresponds to a value of D=3 then the translator generated address will correspond to address 10 which contains the sample required for a value of D of 17. The bits d12, d11 applied to the quadrant select circuit 136 together with control bits QS2, QS1, also applied to the quadrant select circuit 136, uniquely define the appropriate quadrant. Thus, in the present example, if quadrant one is indicated, the data presented at data port #1 is selected; if quadrant two is indicated, the data presented at data port #2 is selected; if quadrant three is indicated, data port #1 is selected in multiplexer 137 and the sign is reversed; if quadrant four is indicated, the data port #2 is selected in multiplexer 137 and the sign is reversed. In this manner, the appropriate digital data is provided to the digital-to-analog converter 140 shown in FIG. 3.

The multiplexer 137 receives the data samples from output ports #1 and #2 which may be encoded in a well-known manner using the 2's complement code. A multiplex circuit, connected to control lead A/B, is used to select sample data from one of the ROM output ports and a known 2's complement sign changing circuit connected to control lead C is used to invert the sign of the selected sample, when required. The circuit details of the multiplex circuit are well known to those skilled in the art and are not shown in the drawing.

Table B shows the state of the A/B control lead and the state of the C control lead for each combination of d12, d11, QS2 and QS1 for the specific example using modulo 8 and modulo 7 address digits. Table B is derived from Table A, with reference to FIG. 7, and defines the logic of the quadrant select circuit for this specific example. The circuit may be readily implemented using standard logic gates or commercially available programmable logic arrays.

TABLE B

| d12 | d11 | QS2 | QS1 | A/B | C |
|---|---|---|---|---|---|
| 0 | 0 | 0 | 0 | A | 0 |
| 0 | 0 | 0 | 1 | B | 0 |
| 0 | 0 | 1 | 0 | A | 1 |
| 0 | 0 | 1 | 1 | B | 1 |
| 0 | 1 | 0 | 0 | B | 1 |
| 0 | 1 | 0 | 1 | A | 0 |
| 0 | 1 | 1 | 0 | B | 0 |
| 0 | 1 | 1 | 1 | A | 1 |
| 1 | 0 | 0 | 0 | A | 1 |
| 1 | 0 | 0 | 1 | B | 1 |
| 1 | 0 | 1 | 0 | A | 0 |
| 1 | 0 | 1 | 1 | B | 0 |
| 1 | 1 | 0 | 0 | B | 0 |
| 1 | 1 | 0 | 1 | A | 1 |
| 1 | 1 | 1 | 0 | B | 1 |
| 1 | 1 | 1 | 1 | A | 0 |

The sample data output of multiplexer 137 is transmitted to a standard multibit latch 139, shown in FIG. 3. The sample data is stored in latch 139 once every clock cycle under control of a system clock pulse $f_c$ and supplied to a commercially available digital-to-analog converter and low pass filter (DAC and LPF) 140, to generate the portion of the output sine wave signal corresponding to the received sample data.

Figure 8:
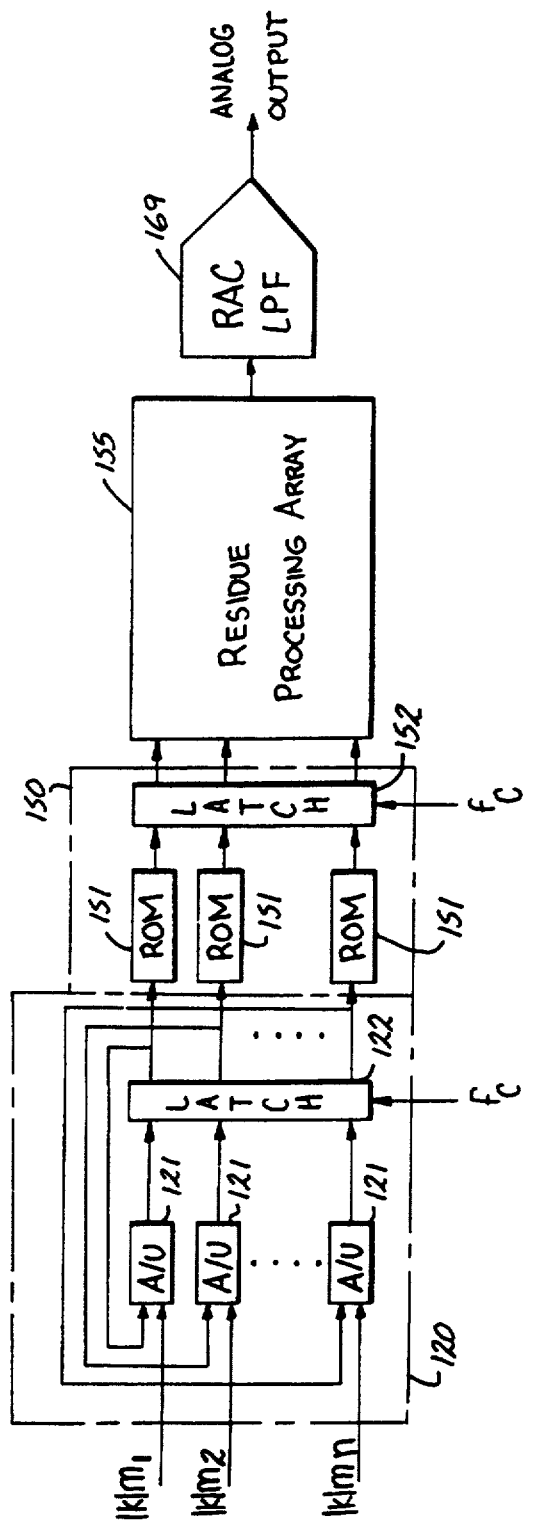
FIG. 8 is a block diagram representation of an alternate embodiment of the circuitry of FIG. 3.

FIG. 8 is a block diagram representation of an alternate embodiment of the invention in which a memory is individually associated with each of a plurality of arithmetic units. FIG. 8 shows the phase accumulator 120 connected to a memory unit 150 consisting of a plurality of sample read-only memories 151 and a latch 152. The phase accumulator 120, as described earlier herein with reference to FIG. 3, comprises a plurality of arithmetic units 121 to which residue digits of a frequency setting word k are applied. The arithmetic circuits are designated in FIG. 8 Ml through Mn. The outputs of the individual circuits 121 are latched in latch 122 under control of the system clock $f_c$. The ROMs 151 store residue encoded values of components of samples of the sinusoidal output wave form and are accessed concurrently by the contents of latch 122. The size of each of the ROMs is determined by the product of its depth and width, that is, the number of addresses and the bit size of data stored at each address location, respectively. For this embodiment, the depth of any ROM is equal to the value of its corresponding modulus. The total depth of all ROMs is therefore equal to the sum of the moduli. This size is much smaller than corresponding sizes for typical binary implementations where the size of the ROM increases exponentially in the number of bits used to address it. Accordingly, this allows the residue digital frequency synthesizer to be fabricated on a smaller silicon area.

The output of ROM memories 151 are latched in latch 152 under control of system clock $f_c$. Latch 152 is connected to a residue processing array 155 where the memory outputs are processed, as described further below. A known residue-to-analog converter and low pass filter (LPF) 169, connected to the output of the processing array 155, generates the desired analog output signal.

Each memory 151 in FIG. 8 comprises a number of address locations. The ith memory stores the residue encoded quantities $\cos c_i |lk|_{M_i}$ and $\sin c_i |lk|_{M_i}$ where $|lk|_{M_i}$ is the output of phase accumulator adder circuit $M_i$ and $C_i$ is a constant. The constants $C_i$ are defined as $$C_i = \frac{2\pi A_i}{M},$$

where M is the product of the moduli and $A_i$ is the integer whose residue representation consists of all zero digits except for a 1 in the ith digit position. When the appropriate residue encoded sine and cosine values are determined for storing into the ith ROM 151, a well-known "nearest integer" rounding technique is used, with the result that these values are residue coded as fractions with the same denominator P. As is well known in residue arithmetic practice, fractions can be represented by their numerators. In summary, then, the sine and cosine values are rounded to the nearest fraction which has denominator P. The residue code is then the residue representation of the numerator of the fraction. The value of P is called the "precision" and is usually chosen equal to a product of small powers of primes, e.g., $210 = P = 2\cdot3\cdot5\cdot7$ or $126 = 2\cdot3^2\cdot7$. The small prime powers determine the size of some of the residue arithmetic units used in the residue processing array 155. The contents of the memory locations of each of the memories 151 at locations defined by the respective outputs of the arithmetic units 121 are simultaneously transmitted to the residue processing array 155.

The residue encoding of the fractions should include moduli which equal the divisors of P and the product of all the moduli should exceed $p^2$, to allow scalings by the value of P in the processing array 155. If the product of the moduli is less than $p^2+1$, then loss of data may result.

It is known from residue number theory that the desired output samples can be written as:

$$\cos(c_1 |lk|_{M_1} + c_2 |lk|_{M_2} + \ldots + c_n |lk|_{M_n}) \quad \text{(Equation A)}$$

where $c_i$ and $|lk|_{M_i}$ are defined above. Using successively the trigonometric identity $\cos(a+b) = \cos(a)\cos(b) - \sin(a)\sin(b)$, Equation A can be rewritten as a sum of products of sine and cosine terms whose arguments involve only a single modulus. Thus, the desired output samples as given by Equation A can be computed as products and sums of the outputs of the ROMS 151. The computation of the product of sums is performed by the residue Processing Array 155 in a well-known manner by the application of known mathematical identities.

Figure 9:
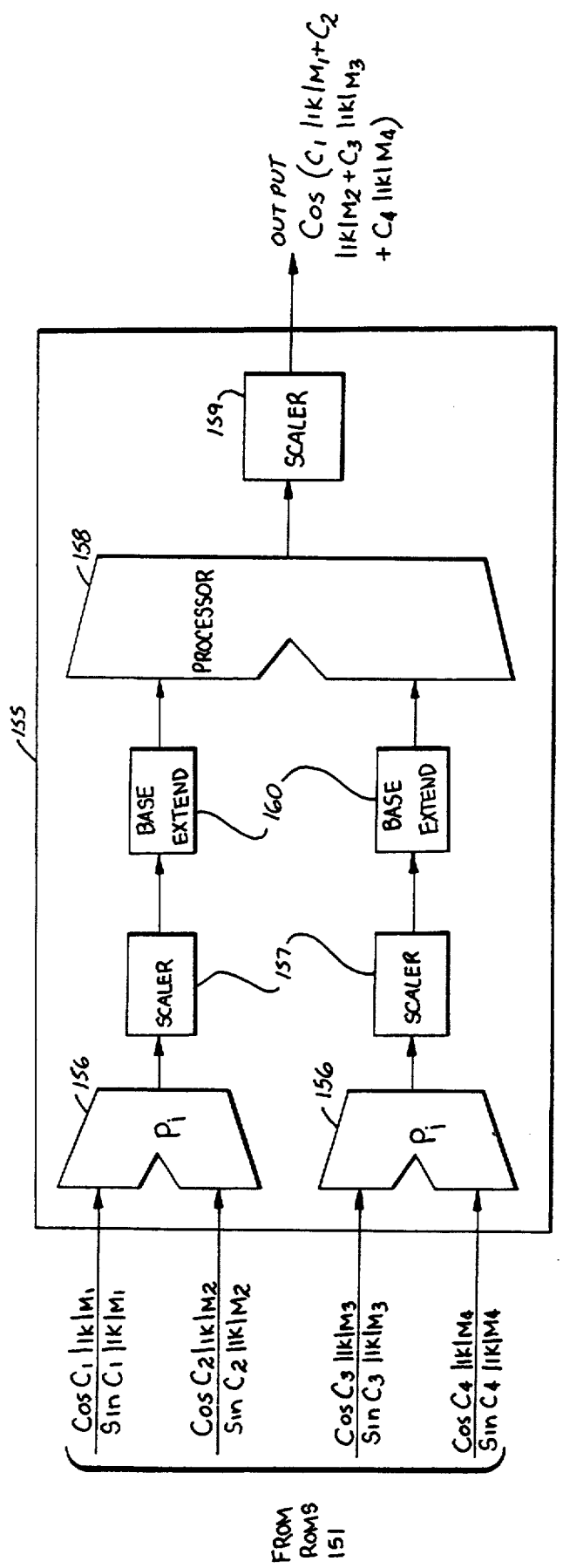
FIG. 9 is a more detailed representation of the residue processing array of FIG. 8.

FIG. 9 is a representation of the residue processing array 155 for implementing (Equation A) for $n=4$. It includes a pair of input processors Pi 156, each connected to a scaler 157. The outputs of the scalers 157 are connected to base extender units (BEs) 160, whose outputs are in turn connected to an output processor Po 158, which is followed by another scaler 159. The number of input channels n to the processing array 155 corresponds to the number of moduli n in the frequency setting word applied to the phase accumulator 120. The four inputs are $\cos c_1 |lk|_{M_1}$ and $\sin c_1 |lk|_{M_1}$, input simultaneously on input channel 1; $\cos c_2 |lk|_{M_2}$ and $\sin c_2 |lk|_{M_2}$ input simultaneously on channel 2; $\cos c_3 |lk|_{M_3}$ and $\sin c_3 |lk|_{M_3}$ on channel 3; and $\cos c_4 |lk|_{M_4}$ and $\sin c_4 |lk|_{M_4}$ on channel 4. These values come from the outputs of the sample ROMS 151. Since the information read from the Phase Accumulator (through latch 122) represents memory address information, the moduli and the number of moduli used in the processing array 155 may be different from the moduli and the number of moduli used in the frequency setting word and phase accumulator. Accordingly, the moduli used in the phase accumulator need not be equal to those used in the processing array. The processing array moduli are chosen with respect to the precision P, as discussed previously.

Figure 10:
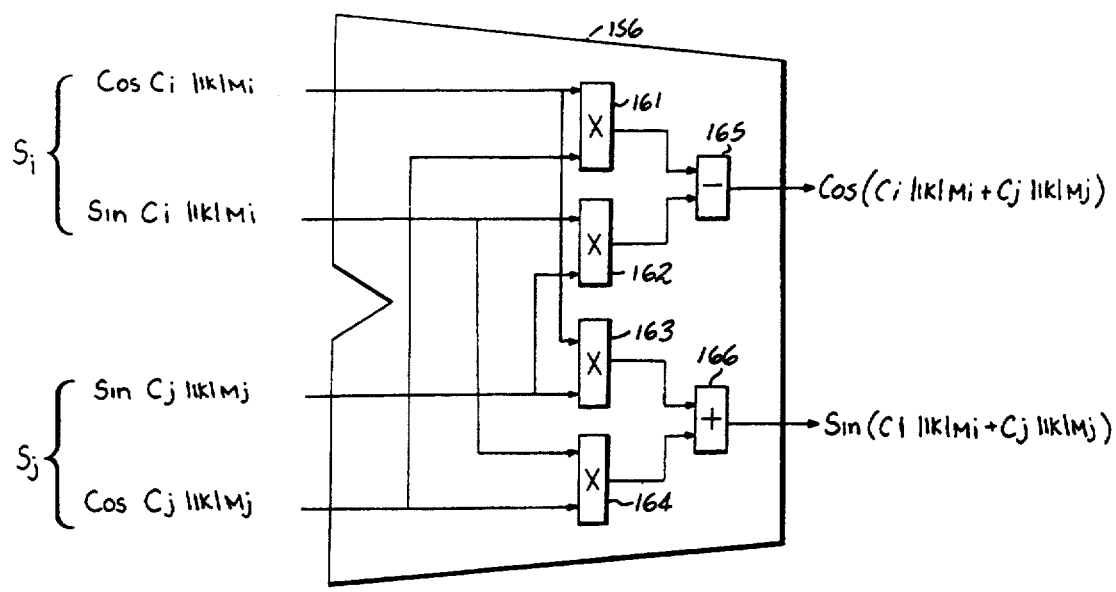
FIGS. 10, 11 and 12 are more detailed representations of circuit blocks of FIG. 9.

FIG. 10 is a more detailed representation of each of the input processors $P_i$ 156 of FIG. 9. Each one of the input processors 156 has two inputs, for example Si and Sj, where each of Si and Sj represents the residue encoded values $\cos c_i |lk|_{M_i}$, $\sin c_i |lk|_{M_i}$ and $\cos c_j |lk|_{M_j}$, $\sin c_j |lk|_{M_j}$, obtained from the ith and jth ROMS 151 shown in FIG. 8. The input processor 156 includes four residue multiplication circuits 161, 162, 163 and 164. In circuit 161, the cosine values obtained from the two memory locations are multiplied and in circuit 162 the sine values obtained from the same memory locations are multiplied. In a residue subtracting circuit 165, connected to circuits 161 and 162, the output of circuit 162 is subtracted from the output of circuit 161. The output of circuit 165 is the cosine sum term shown in FIG. 10. In circuit 163, the cosine value of the first input Si and the sine value of the second input Sj are multiplied and in circuit 164 the sine value of the first input Si and the cosine value of the second input Sj are multiplied. Circuits 163 and 164 are connected to a residue adder 166 circuit where the products generated by circuits 163 and 164 are added and the residue encoded output, referred to as $\sin(c_i |lk|_{M_i} + c_j |lk|_{M_j})$, is generated.

In the four input processing array 155 shown in FIG. 9 two input processors 156 are used, each generating a pair of outputs. The lower unit Pi 156 in FIG. 9 generates outputs $\cos(c_3 |lk|_{M_3} + c_4 |lk|_{M_4})$ and $\sin(c_3 |lk|_{M_i} + c_4 |lk|_{M_4})$. The upper input processor Pi 156 generates $\cos(c_1 |lk|_{M_1} + c_2 |lk|_{M_2})$ and $\sin(c_1 |lk|_{M_1} + c_2 |lk|_{M_2})$. These values are applied to the output processor Po 158 through scaler circuits 157 and base extenders BE 160. As shown in FIG. 9, a scaler circuit 157 is connected to the output of each of the input processors 156. The scaler 157 performs the function, on both the cos and sine terms, of reducing the magnitude of the values generated by the input processors 156, by the factor P. This is done in the manner described earlier herein with respect to scaler 127 and FIG. 4.

The base extender 160 performs the function (on both the cos and sin terms) of restoring the residue digits that were erased by the scaling operation. As is well known in residue theory, the action of a scaler unit such as 157, while reducing the magnitude of its input, also reduces the number of digits in the residue representation. These "erased" digits must be restored, and the restoration is accomplished by a well-known operation in residue theory called "base extension." In the present embodiment, the scaling is by the factor P and therefore the digits that are erased correspond to those moduli which divide (i.e., are factors of) P.

Figure 12:
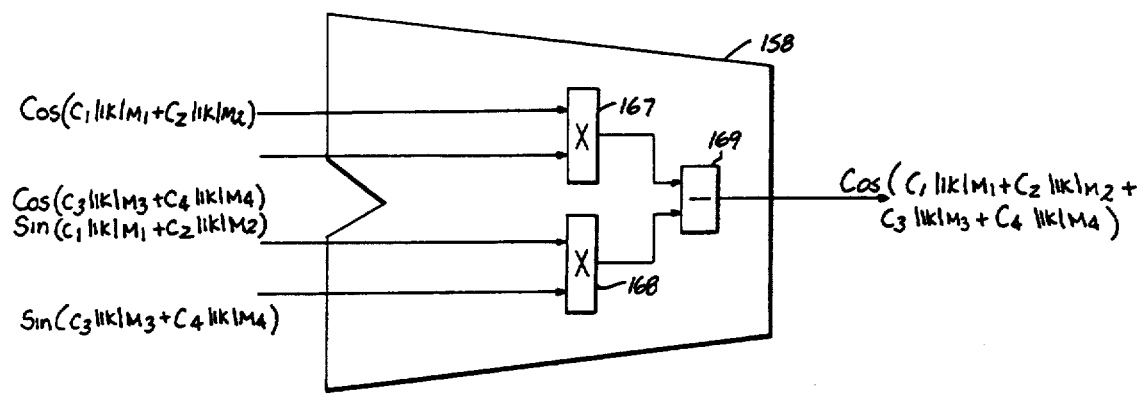
Figure 11:
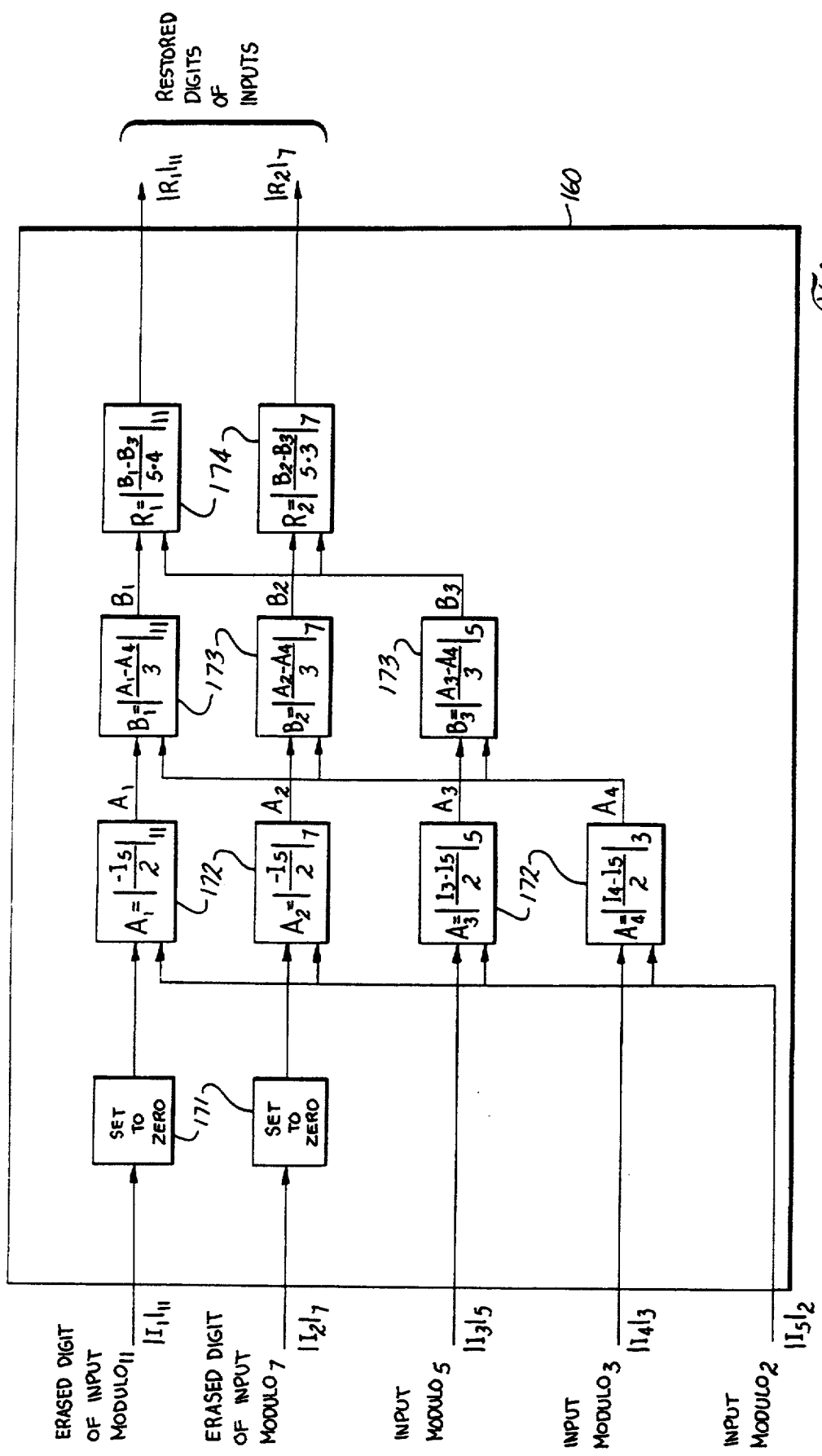

Base extender units 160 are widely known in the art and are constructed as depicted in FIG. 11. This figure shows a five-digit residue input with two erased digits being restored on the output. The moduli at the input are (2, 3, 5). The erased (and restored) moduli at the output are (7, 11). The units 160 are comprised of a level of zero-setting circuits 171 (one for each digit to be restored), and a level of modscaler circuits 172, 173 and 174 for each non-erased input residue digit. The modscaler circuits are identical in construction to the modscalers 226 used in the scaler 127 in FIG. 4. The set-to-zero units 171 produce zero outputs under all conditions and are built by grounding the output lines. Modscaler units 174 incorporate an extra division by the factors 4 (mod 11) and 3 (mod 7) as shown in the FIG. 11. The output of the two base extenders 160 is applied to the output processor Po 158, shown in greater detail in FIG. 12. In circuit 167 of the output processor 158, the cosine terms obtained from input processors 156, scalers 157 and BEs 160 are multiplied, and in circuit 168 the sine outputs obtained from input processors 156, scalers 157 and BEs 160 are multiplied. The circuits 167 and 168 are connected to residue subtracter 169 which generates an output represented by the cosine of a sum of terms, as illustrated in FIG. 12 and is the desired output as given by Equation A.

The output of processor Po (158) is the input to a scaler 159, which is identical to scalers 157 and which serves to limit the magnitude of the output of Po 158.

The residue-to-analog converter (RAC) and LPF 169 of FIG. 8, which receives the output of the residue processing array 155, is a known device which has been described in the literature. It converts the residue input signals into a binary equivalent and then generates an analog output signal in accordance with conventional digital-to-analog conversion techniques. The LPF is used to smooth the output signal of the RAC. Its use is standard practice for both RACs and DACs.

Figure 13:
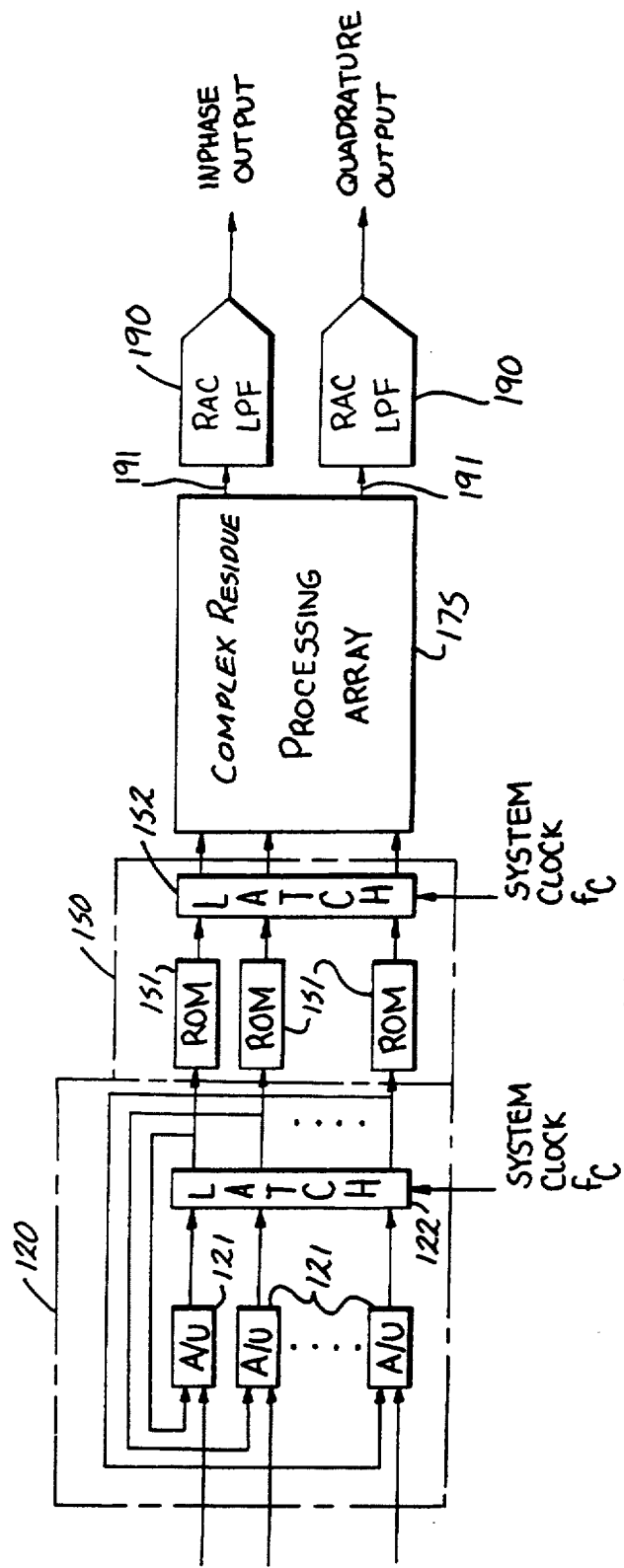
FIG. 13 is an alternate embodiment of the direct digital synthesizer of FIG. 3.
Figure 14:
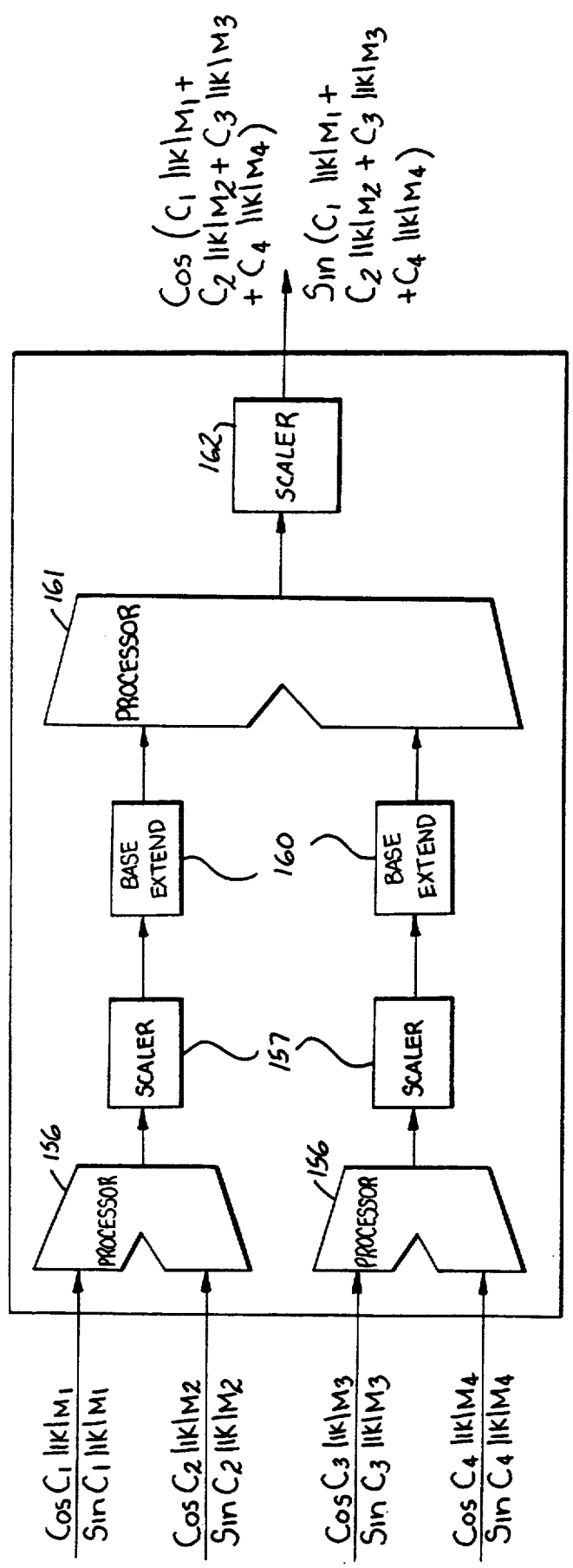
FIGS. 14 is a more detailed representation of the processing array of FIG. 13.

FIG. 13 is an alternate embodiment of the invention, using the phase accumulator 120 and the memory structure 150 shown in FIG. 8, and generating a complex output, i.e. having real and imaginary components in the form of sine and cosine waveforms. The circuit of FIG. 13 includes a complex residue processing array 175 connected to a pair of the residue-to-analog converters 190 depicted as 169 in FIG. 8. In this configuration an in-phase signal, commonly the cosine signal, is generated together with a quadrature sine wave signal. FIG. 14 is a diagrammatic representation of the complex residue processing array 175 for a system which uses n=4 phase accumulator moduli. The input values received from the memories 151 are in the same format as for the non-complex case described with reference to FIG. 8. In the non-complex case, for any input argument, the cosine of the sum of the inputs is computed as described before using the Equation A. In the present embodiment, where both the in-phase and the quadrature outputs are produced, the sine of the sums of the input arguments as well as the cosine of the sums of the arguments is computed. This is accomplished in the processing array 175 of FIG. 14 in a manner substantially identical to that described above with reference to FIG. 9 for the array 155. Instead of the processor Po 158 in FIG. 9, the array 175 uses a processor $P_i$ 161 identical to the input processors $P_j$ 156 shown in FIG. 9 and FIG. 14. Furthermore, the output scaler 162 is identical to the scalers 157 shown in FIG. 9 and in FIG. 14.

The output of scaler 162, consisting of both cosine and sine samples, is then applied to inphase and quadrature RACS and LPFs 190. These units are identical to those used in the non-quadrature output design shown in FIG. 8.

It will be understood that the embodiments described herein are merely illustrative of the application of the principles of the invention and that numerous other arrangements may be devised without departing from the spirit and scope of the invention.

What is claimed is:

1. Signal generating apparatus comprising:
  a memory having a plurality of address input terminals, a plurality of individually addressable locations storing data defining values of samples of an output signal and a plurality of output terminals; and
  an address generator having a plurality of address generator input terminals and having a plurality of address generator output terminals connected to the address input terminals;
  the address generator comprising a plurality of discrete and independent binary adder circuits connected to the address generator input terminals, the address generator responsive to a plurality of input data words representing residue digits of differing moduli applied to the address generator input terminals to add predefined quantities to each of the input data words by operation of the independent binary adder circuits thereby generating on the address generator output terminals a combined residue output word having a plurality of residue digits, each digit representing the residue for one addition of a predefined quantity to one of the input data words;
  the memory responsive to the combined residue output word to read one of the individually addressable locations and to provide a selected output signal sample at the memory output terminals.

2. The apparatus in accordance with claim 1 and further comprising a scaler circuit connected between the address generator output terminals and the memory input terminals, the scaler circuit comprising divider circuitry generating an output data word representing a quotient resulting from the division of the combined residue output word by one of the moduli of the combined residue output word and wherein the memory is responsive to the quotient word to read the predefined memory location.

3. The apparatus in accordance with claim 1 and further comprising a clock circuit generating periodic clock pulses and wherein the address generator further comprises a data storage circuit connected between the binary adder circuits and the address generator output terminals, the data storage circuit storing the combined residue output word and responsive to the clock pulses to periodically reproduce the combined residue output word at the address generator output terminals.

4. The apparatus in accordance with claim 1 and further comprising a digital to analog converter circuit connected to the memory circuit operative to convert digital memory output data words to analog signals.

5. The apparatus in accordance with claim 1 and further comprising a translator circuit connected to the address generator output terminals and the memory input terminals and a sample select logic circuit connected to the address generator output terminals and the memory output terminals, the translator circuit operative to translate a selected portion of the combined residue output word and generate a memory address defining a selected location of the memory storing data representative of a portion of a symmetrical signal to be generated and the sample select circuit operative to selectively modify output data read from the selected location in accordance with the states of predefined bits of the combined residue output word.

6. The apparatus in accordance with claim 5 wherein the memory comprises a dual port memory having a first address input port connected to output terminals of the address generator and a second address input port connected to the translator circuit and first data output port activated in response to an address applied to the first address port and a second data output port activated in response to an address applied to the second address input port, the first and second data output ports connected to the sample select circuit, and wherein a portion of the combined residue output word is applied as an address to the first address port and the memory address generated by the translator is applied as an address to the second address port, and wherein the sample select circuit is further responsive to data bits read from the memory to select one of the first and second data output ports and to selectively modify data read from a selected output port.

7. The apparatus in accordance with claim 6 wherein the predefined bits of the combined residue output word comprise the most significant bits of one of the digits in the combined residue output word.

8. The apparatus in accordance with claim 6 and further comprising a clock circuit generating periodic clock pulses and wherein the sample select circuit further comprises an output data storage circuit for storing digital output signals and responsive to the clock signals to periodically generate sample select circuit output signals.

9. The apparatus in accordance with claim 6 and further comprising a scaler circuit connected to the output terminals of the address generator and wherein the translator and the first address input port are connected to the translator via the scaler circuit.

10. The apparatus in accordance with claim 1 wherein the memory comprises a plurality of discrete and independent memory units, each having a plurality of memory locations and each having an address input terminal connected to one of the binary adder circuits, whereby one of the digits of the combined residue output word is individually applied to each of the discrete memories, the discrete memories individually responsive to an applied digit of the combined residue output word to selectively read a memory location.

11. The apparatus in accordance with claim 10 and further comprising a residue processing array connected to the discrete memories and wherein the discrete memories each contain a residue data element, the residue processing array operative to convert the residue data elements read from the plurality of discrete memories to a single data term defining a sample of a predefined signal to be generated.

12. The apparatus in accordance with claim 11 and further comprising a residue-to-analog converter circuit operative to generate an analog output signal corresponding to the single data word.

13. The apparatus in accordance with claim 12 wherein the residue processing array comprises a plurality of interconnected multiplier circuits interconnected to multiply data words received from each of the memory elements to generate the single data word.

14. The apparatus in accordance with claim 9 wherein the discrete memories contain complex variable data defining an element of a sample of the output signal and an element of a sample of the complex conjugate of the output signal.

15. The apparatus in accordance with claim 14 and further comprising a residue processing array operative to convert the complex variable data from each of the discrete memories to a data word representing a selected sample of a predefined output signal and a sample of a data word representing the complex conjugate of the output signal.

16. The apparatus in accordance with claim 15 and further comprising a first residue-to-analog converter operative to generate an analog output signal corresponding to the data representing the predefined output signal and a second residue-to-analog converter operative to generate an analog output signal corresponding to the data representing the complex conjugate of the predefined output signal.

17. A method of generating periodic output signals of selected signal periods, comprising the steps of:

storing in a memory a plurality of data words at a plurality of address locations, each data word defining a sample of an output signal to be generated;

generating a frequency setting word comprising a plurality of residue output digits of differing moduli;

periodically adding predefined quantities to each of the residue output digits to periodically generate a combined residue output word having a plurality of digits, each digit representing the residue for one addition of a predefined quantity to a digit of the frequency setting word;

periodically reading data words defining selected samples from the memory at address locations defined by the combined residue output word; and generating an output signal from data words read from the memory.

18. The method in accordance with claim 17 wherein the step of periodically reading data words from memory further comprises the steps of generating a first memory address and a second memory address from the combined residue output word and the step of reading a first sample from a first address location defined by the first memory address and simultaneously reading a second sample from a second address location defined by the second memory address, the second sample having a value equal to the value of a sample advanced from the first sample by one quarter of the period of the signal to be generated, and the step of selecting one of the first and second samples.

19. The method in accordance with claim 18 wherein the step of reading the first and second address locations comprises generating memory addresses from selected bits of the combined residue output word and the step of selecting one of the first and second samples comprises selecting one of the first and second samples on the basis of predetermined bits of the combined residue output word.

20. The method in accordance with claim 19 wherein the step of selecting one of the first and second samples comprises storing selected data bits in the memory samples and selecting one of the first and second samples on the basis of the selected bits stored in the memory.

21. The method in accordance with claim 20 wherein the predetermined bits of the combined residue output word form the most significant digit of the combined residue output word.

22. The method in accordance with claim 17 wherein the step of storing comprises storing residue data words of differing moduli in a plurality of independent memories and the step of periodically reading comprises reading each of the independent memories at address locations defined by a digit of the combined residue output word uniquely associated with one of the independent memories and the step of processing residue data words read from the independent memories to define samples of a signal to be generated.

* * * * *